United States Patent
Wade et al.

(10) Patent No.: US 6,169,820 B1
(45) Date of Patent: *Jan. 2, 2001

(54) DATA COMPRESSION PROCESS AND SYSTEM FOR COMPRESSING DATA

(75) Inventors: Michael R. Wade, Parker, CO (US); Arthur G. Sutsch, Alterswil (CH)

(73) Assignee: TECOMAC AG(CH)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/646,358
(22) PCT Filed: Sep. 12, 1995
(86) PCT No.: PCT/EP95/03595
§ 371 Date: Aug. 5, 1996
§ 102(e) Date: Aug. 5, 1996
(87) PCT Pub. No.: WO96/08872
PCT Pub. Date: Mar. 21, 1996

(51) Int. Cl.$^7$ .................................... G06K 9/36
(52) U.S. Cl. ............................................. 382/239
(58) Field of Search ................... 382/232, 233, 382/236, 237, 238, 239, 246, 249; 348/419; 358/430, 432, 427, 261.2; 395/13

(56) References Cited

U.S. PATENT DOCUMENTS

| | | | |
|---|---|---|---|
| 4,813,056 | 3/1989 | Fedele | 375/27 |
| 4,839,724 | 6/1989 | Keesen et al. | 358/138 |
| 5,138,673 | * 8/1992 | Yoshida et al. | 382/238 |
| 5,319,724 | * 6/1994 | Blonstein et al. | 382/248 |
| 5,379,355 | * 1/1995 | Allen | 382/238 |
| 5,432,870 | * 7/1995 | Schwartz | 382/232 |
| 5,532,694 | * 7/1996 | Mayers et al. | 341/67 |
| 5,539,842 | * 7/1996 | Schwartz | 382/232 |
| 5,615,287 | * 3/1997 | Fu et al. | 382/236 |
| 5,717,787 | * 2/1998 | Feo et al. | 382/232 |
| 5,892,847 | * 4/1999 | Johnson | 382/232 |

FOREIGN PATENT DOCUMENTS 0582907    2/1994    (EP).

* cited by examiner

Primary Examiner—Jose L. Couso
(74) Attorney, Agent, or Firm—Majestic, Parsons, Siebert & Hsue P.C.

(57) ABSTRACT

The present invention relates to processes for compressing data and to corresponding systems. The data to be compressed may here be analog or digital speech and image data, or may be any data provided by computers.

17 Claims, 1 Drawing Sheet

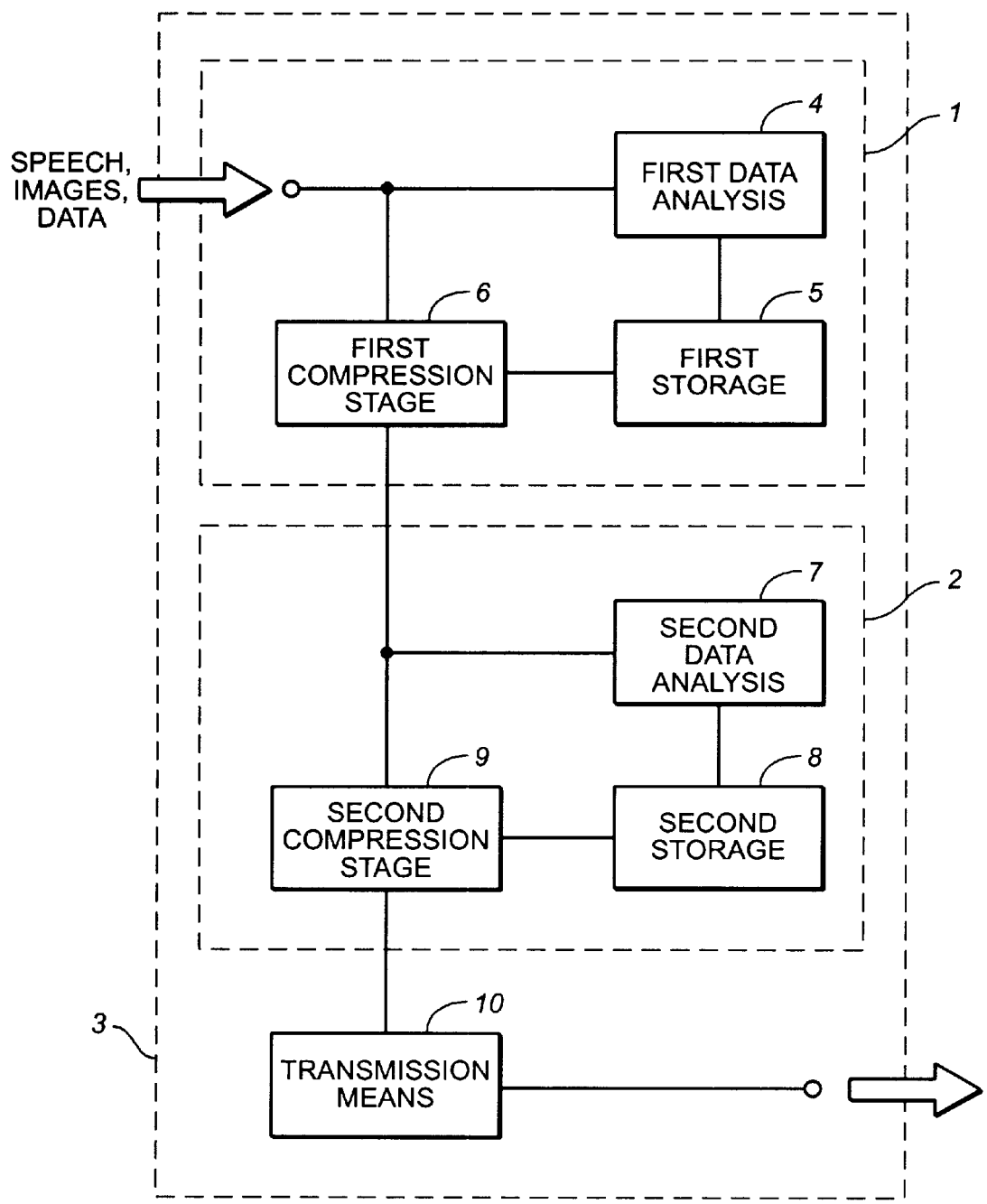

DATA COMPRESSION PROCESS AND SYSTEM FOR COMPRESSING DATA

BACKGROUND OF THE INVENTION

The present invention relates to processes for compressing data and to corresponding systems. The data to be compressed may here be analog or digital speech and image data, or may be any data provided by computers.

Data compression methods are used for eliminating or reducing redundancies in data streams that are to be transmitted or stored, whereby data streams can be stored with the required memory area being reduced, or whereby the streams can be transmitted with smaller bandwidths or at increased speeds.

Known compression methods which are presently employed for transmitting data on data or telephone lines are normally based on the so-called LZW (Lempel, Ziv, Welch) algorithm or the so-called Huffman algorithm, which is especially used in facsimile transmissions.

Simply speaking, the LZW algorithm is based on the measures that a transmission data stream is analyzed for the presence of elementary data groups contained therein and that a location is assigned to the determined data groups in a tree representing the individual data groups.

The determined data groups can then be transmitted—by corresponding agreement with the receiver side and instead of their Information content proper—by means of codes that represent their position within the tree, whereby good compression results become achievable, especially in the case of data streams with constantly recurring patterns.

Since the memory area which is required for learning elementary data groups that appear in the data stream is limited, i.e. the ramification of the tree cannot exceed a predetermined degree, the "built tree" must be renewed from time to time to adjust or adapt it to a changed structure of the transmission data as compared to the structure that existed during the learning process.

When a new "tree" is built, the learnt structural interrelationships, which might also be valid for the new data, are lost. Until the construction of a new tree the data will be compressed less efficiently, at least for some time, resulting in a reduction of the achievable compression factor on the whole.

Especially in synchronous systems, this reduced compression efficiency is disadvantageous because a transmission will only be possible within predetermined time slots. In contrast to asynchronous systems, a decrease in the achievable compression might thus lead to a superproportional increase in the time needed for transmission.

It is the object of the present invention to provide processes for efficiently compressing data as well as systems suited therefor.

This object is achieved in an inventive manner through the subject matters of patent claims 1, 5, 20, and 23.

Preferred embodiments are outlined in the subclaims.

SUMMARY OF THE INVENTION

One aspect of the present invention is based on the finding that compression methods which have so far been employed do not work efficiently for the reason that they just determine predominantly short-time variations in the data streams by means of the used compression algorithms and take these variations into account for the compression. For instance, when an LZW algorithm is used in a synchronous environment, it is just the variations within a data block (frame) that are normally taken into account for compression. Basic repetitions and structures within a specific type of data are thus not sufficiently taken into account for compression.

The compression process is therefore performed in two stages in accordance with the above-mentioned first aspect of the present invention:

a first stage in which the structures, interrelationships or patterns which have been learnt over a long period of time and which arise within a specific type of data are taken into account for the compression of an instantaneous data stream; and a second stage in which short-time variations of the compression data stream are taken into account, as is e.g. the case with the above-mentioned LZW algorithm.

The said process is especially advantageous for the reason that the compression operation in the second stage which, as mentioned, can be implemented by conventional compression methods is improved as to its efficiency because it receives precompressed data as input data that consist of data groups having small input lengths, with respect to which the LZW algorithm, for example, can operate more efficiently, i.e. closer to its theoretically achievable optimum compression capacities.

Frequency distributions of elementary data groups within the compression data stream, as have been determined for the corresponding type of data over a long period of time, are preferably taken Into account for compression purposes within the first stage, i.e. precompression. The thus determined elementary data groups which constantly recur even over long periods of time, for example specific speech patterns, specific combinations of numbers, or specific image sections, are preferably arranged in the order of their frequency so that the most frequently occurring data groups are represented by correspondingly short codes and less frequently occurring data groups, which have nevertheless been data groups taken into account in the precompression stage, are represented by correspondingly longer codes.

Another aspect of the present invention according to patent claim 1 regards a compression process which can be performed in a single stage and is based on the measure that elementary data groups which are frequently repetitive over a longer period of time are "learnt" for a compression data stream and stored in a storage device. The instantaneous compression data stream is analyzed for the presence of said learnt elementary data groups and correspondingly learnt data groups are subsequently replaced by codes which represent the position of the learnt data groups within the storage device or within a table. As a consequence, the data stream compressed in this manner can again be decompressed when being read out from a memory, or at the receiver side, by looking it up in the table.

The codes as used preferably correspond to the addresses of the learnt and replaced data groups within the table, the address agreement being possibly also such that only address differences between two successive replaced data groups are used for coding.

The process according to claim 1 can preferably be combined again with a second compression stage, in accordance with the first aspect of the present invention.

Other aspects of the present invention regard data compression devices or transmission devices which achieve a data compression in accordance with the above process.

Preferred embodiments of the present invention are now explained in detail with reference to the enclosed drawing.

BRIEF DESCRIPTION OF THE DRAWINGS(s)

The drawing is a block diagram used for illustrating preferred embodiments of the processes according to the invention as well as the systems according to the invention.

DESCRIPTION OF THE PREFERRED EMBODIMENT

The figure shows a function group 1 surrounded by a broken line, which serves to compress analog or digital speech or image data or to compress data provided by computers.

A second function group 2, which is also surrounded by a broken line, serves the further compression of the precompressed data supplied by the first stage.

Reference sign 3 designates a transmission system for transmitting compressed data. This transmission group includes the two compression stages 1 and 2.

It should explicitly be noted that the present invention also relates to each of the said function groups individually and also to a compression process as described with reference to function group 1 and to a compression process as described with reference to function groups 1 and 2, namely independently of each other.

The sent speech, image or computer data are supplied to a data analyzing device 4 in which individual repetitive elementary data groups can be recognized. A specific number of different and most frequently recurring data groups are stored in storage device 5. The most frequently occurring data groups are preferably stored in a table in the order of their frequencies. These most frequent data groups can be learnt at the data stream to be actually compressed or at a previously analyzed data stream with similar characteristics.

The data stream to be actually compressed also runs through the data analyzing device 4 in order to recognize already learnt data groups within the data stream and to replace these corresponding data groups in the first compression stage 6 by codes.

The addresses of the most frequent data groups as stored in storage device 5 are preferably used as codes so that a correspondingly compressed data stream will later allow a decompression of the data stream with the aid of the known allocation between addresses and stored elementary data groups.

The differences between the addresses of two successive and replaced data groups are preferably used as codes. Hence, there is no absolute address allocation, but a relative address allocation. This normally permits the use of shorter codes, i.e. codes with smaller bit numbers.

Moreover, the known data groups previously learnt and stored in storage device 5 can be arranged in accordance with their frequency, which means that shorter addresses are rather assigned to frequent data groups, and not to less frequent data groups.

For instance, it has been found in tests that only about 4000 different data groups occur in data transmitted in interbank transactions. With such a small number of different data groups it is even possible to code all of the occurring data groups, resulting in an especially high data compression.

The compressed data can be stored in a storage device, whereby the memory area needed for storage is considerably reduced as compared to storing in non-compressed form. The data can also be transmitted to a receiver, whereby the bandwith required for the transmission is reduced or the achievable transmission rate is increased. After the data have been read out from the memory, or at the receiver side, the compressed data can then be decompressed with the aid of the known allocation scheme between codes and the learnt most frequent data groups. Of course, the corresponding allocation table must be known to the receiver, which may be done at the beginning of the transmission process or also just sporadically when the transmission data have actually changed considerably with respect to their structure and characteristics as compared to the time of learning.

The first compression stage is preferably followed by another compression process. The latter may be based on known compression methods, such as the LZW algorithm or the Huffman algorithm. In this additional compression stage, which is altogether formed by function block 2, a compression step may be taken in which short-time variations in the decompression data are taken into account. For instance, it is only the patterns or characteristics which can be recognized within a frame that are taken into account in cases where this stage performs a compression in accordance with the LZW algorithm and operates in a synchronous environment.

In this additional compression stage, too, the compression data are first analyzed in a data analyzing device 7. Data groups which have been learnt again are stored in another storage device 8. When an LZW algorithm is used, this will be the structure of the built tree. The compression step proper will then be performed in unit 9, based on the results supplied by units 7 and 8.

As mentioned at the outset, when the LZW algorithm is used, the learnt data stored in the second storage device are discarded from time to time to achieve an adaptation to the data to be actually compressed at the moment. Since the compression stage 2 contains data already precompressed by stage 1, stage 2 is able to operate at a higher efficiency than would be the case if the input data were supplied in uncompressed form to said second stage.

Both function group 1 and function group 2 may altogether be contained in a transmission system 3. In such a case transmission system 3 additionally contains a transmission device 10 with the aid of which the compressed data can be transmitted to a receiver. The transmission device 10 may be a device as is known in modem technology.

A special advantage of the present invention is that a high compression is possible without any loss of specific information contents. The compressed data to be finally stored or transmitted can subsequently be reverted into the original data by corresponding decompression and/or decoding operations.

As already mentioned above, the compression data could also be video or audio data or video or audio signals (also in analog form). The lossless compression provided by the present invention has advantages over conventional methods in which a compression process is always accompanied by a loss of information, especially in the video field.

When the inventive compression, especially the two-stage compression, is applied to video signals, areas or patterns within a video image that do not significantly change over a specific period of time will be processed in the first compression stage and, instead of a recording or transmission of the signals representative of the corresponding areas or patterns, it is just the corresponding codes that will be recorded or transmitted. These will then be decoded again into the original image contents during reproduction of the recorded video signals, or at the receiver.

Thus a corresponding system will learn, preferably on the basis of successive images, which video contents occur frequently and can therefore be replaced by corresponding table references, instead of being transmitted individually. The corresponding system will thus adapt its table contents, which is needed for the first compression process, independently and in accordance with the images to be instantaneously processed. Of course, it is here possible to resort to table contents which have already been learnt and are typical of specific images. Moreover, it will be possible to update the table contents prepared for the first compression when specific frequently recurring data or signal patterns are recognized in the second compression stage. These data or signal patterns are preferably already taken into account in the first compression stage by means of corresponding table references.

Examples of picture elements or patterns which are preferably compressed in the first stage are signals that recur on account of the format (PAL; SECAM), blanking rates, resolution patterns inherent to the camera (blank, black, white switching; reference adjustment patterns) and other repetitive image patterns, such as the unchanged background of an image, frequency occurrences of pixel sequences or gradients thereof. Generally speaking, medium-specific features as well as repetitive picture elements can be compressed in the first compression stage.

In a subsequent second compression stage, common features that exist between successive images for short periods are then exploited for further compression.

Of course, the inventive compression, especially of image data, can already be used during signal detection. This means that the entire image information need not first be received and temporarily stored for subsequently performing a compression step, but the sensor device performing the detection (e.g. CCD, diode, tube sensors) is capable of performing at least the compression of the first stage itself. Such a sensor device which is improved in accordance with the invention can, for instance, check various scanning lines for repetitive image patterns and may assign specific codes to these image patterns if corresponding repetitive image patterns are present. Hence, instead of the corresponding patterns, it is only the corresponding codes that are output.

Such a sensor device which already provides compressed output data seems to be of particlar advantage to aerospace applications. The temporary storing of very large data volumes is possibly out of question in the case of aerospace applications so that the storing and/or transmission of already compressed data is advantageous.

Especially with aerospace applications, conventional compression methods can normally not be employed, since a loss of information during compression is not acceptable. By contrast, the inventive compression ensures that the original image can subsequently be restored true to the original and without loss of even the slightest video changes. According to the process of the invention, the information that the image area in question is a black background is, for example, not the only piece of information transmitted with respect to a black background, but small noise-induced changes in the background are also evaluated and made available for reconstruction at a later time. As a result, noise information that might be of help to a later image correction in the recorded object is not lost, but is also recorded and transmitted, Of course, such small changes can also form patterns of their own which, in turn, can then be subjected to a corresponding compression.

As already mentioned, speech applications constitute a preferred field of application of the present invention. A person's speech also contains long-time patterns which can be learnt and stored in a table. Such long-time patterns regard parlance, intonation, pitch, etc. These patterns can be learnt for a specific speaker and stored in a table. When the corresponding speech is then stored or transmitted, these characteristics will no longer be transmitted as part of a spectrum, but only as codes. Of course, this applies also to music so that, generally speaking, the present invention is specifically suited for sound applications as well.

What is typical of the said sound applications and the above-mentioned image applications is the fact that repetitive patterns are learnt in a learning phase so that subsequent data or signals can be expressed in compressed form by means of a corresponding code assignment. Short-time changes are preferably exploited additionally in a second compression stage for compression purposes.

Thus a special and interesting use of the present invention is also possible with audio or video CDs on which information can be stored in a compressed form according to the present invention. The code assignment used for the first compression stage, i.e. the table, can for instance also be stored on the CD so that the apparatus which is meant to reproduce the stored information can perform a corresponding decompression based on the code assignment which has also been stored.

What is claimed is:

1. A process for compressing a data stream by means of electric devices, comprising:
   (1) analyzing a first representative data stream over a predetermined period of time for recognizing data groups recurring within the representative data stream;
   (2) determining a specific number of different data groups most frequently occurring in the first representative data stream during the predetermined period of time, wherein said first representative data stream is not compressed;
   (3) storing the specific number of data groups in a table;
   (4) analyzing a second input data stream which is to be compressed for the presence of any of the data groups contained in the table;
   (5) performing a first data compression by replacing each of the data groups found in said data stream to be compressed by a corresponding code indicating the position of each replaced data group within the table to obtain a precompressed data stream, wherein said table used in the first data compression does not change in response to frequency of the data groups in the second input data stream; and
   (6) performing a second data compression on the precompressed data stream to form a compressed data stream.

2. The process according to claim 1, wherein each of the codes corresponds to an address of the corresponding data group in the table.

3. The process according to claim 1, wherein each of the codes respectively represents an address difference between the address of the most recently coded data group in the table and the address of an instantaneously coded data group in the table.

4. The process according to claim 1, wherein the data groups are arranged in the table in the order of their frequencies.

5. The process according to claim 4, wherein the shortest codes are assigned to the most frequent data groups.

6. The process according to claim 1, wherein the table is updated with respect by repeating the steps (1) to (3).

7. The process according to any one of claims 1 to 6, wherein the compressed data stream is transmitted to a receiver.

8. The process according to claim 1, wherein the compressed data stream is thereby stored.

9. The process according to claim 1, wherein the compressed data stream is transmitted to a receiver, and further wherein the compressed data stream is thereby stored.

10. The process according to claim 7, wherein the receiver is informed about the table with the most frequent data groups and the coding as agreed on.

11. The process according to claim 10, wherein the receiver decompresses the data stream by means of the table.

12. The process according to claim 7, wherein the transmission is performed in synchronous form.

13. A data transmitting system comprising:

a first data analyzer analyzing a representative type of transmission data and recognizing repetitive elementary data groups;

a determining device determining which data groups most frequently occur during a predetermined period, wherein the representative type of transmission data is not compressed;

a storing device storing the thus determined most frequent data groups in a table;

a second data analyzer analyzing an input data stream which is to be transmitted for the presence of said most frequent data groups stored in said table;

a data generator generating a precompressed data stream in which the thus recognized most frequent data groups are replaced by codes by means of which the positions of the replaced data groups within the table can be recognized, wherein the table used in the generation of the precompressed data stream does not change in response to frequency of the data groups in the input data stream;

an additional data compressing mechanism additionally compressing the precompressed data stream; and a transmitter transmitting the additional compressed data stream to a receiver.

14. The data transmitting system according to claim 13, wherein the table is transmitted to the receiver.

15. The data transmitting system according claim 13, wherein the transmitter operates in a synchronous mode.

16. The data transmitting system according to claim 13, wherein the additional data compression mechanism performs a compression based on the LZW standard.

17. The data transmitting system according to claim 13, wherein the additional data compression mechanism performs a compression as is normally employed in facsimile transmissions.

* * * * *